United States Patent [19]

Bitterling

[11] 3,904,893

[45] Sept. 9, 1975

[54] AMPLIFIER, ESPECIALLY FOR LOW FREQUENCIES, UTILIZING PARALLEL AMPLIFYING CHANNELS WITHIN NPN TRANSISTORS

[76] Inventor: Kay M. Bitterling, Schonburgstrasse 1, 1000 Berlin 42, Germany

[22] Filed: Jan. 4, 1974

[21] Appl. No.: 430,629

[30] Foreign Application Priority Data

Jan. 10, 1973 Germany ............................ 2301017

[52] U.S. Cl. ................ 307/254; 307/255; 307/296; 330/10

[51] Int. Cl.² ...................... H03K 17/60; H03K 1/00

[58] Field of Search ...... 330/10; 307/254, 255, 296, 307/243, 300, 261; 332/9, 9 T

[56] References Cited

UNITED STATES PATENTS

| | | | |
|---|---|---|---|
| 3,400,334 | 9/1968 | Ross et al. | 330/10 |
| 3,551,851 | 12/1970 | Engel | 330/10 |

FOREIGN PATENTS OR APPLICATIONS

| | | | |
|---|---|---|---|
| 1,141,675 | 2/1957 | Germany | 330/10 |

*Primary Examiner*—Michael J. Lynch
*Assistant Examiner*—B. P. Davis
*Attorney, Agent, or Firm*—Walter Becker

[57] ABSTRACT

An amplifier, especially for low frequencies, in which an amplitude modulated signal is mixed with a saw-tooth signal and is supplied to respective comparators so as to be converted into positive and negative pulse width modulated pulses. The comparators are arranged to control the widths of the respective pulses. A pair of amplifying channels each using NPN transistors in series receives the respective pulses and supplies the pulses in amplified form to a common load terminal. The NPN transistors have a high voltage tolerance and a medium switching time. The circuit includes resistors to prevent the transistors at the input ends of the amplifying channels from going to saturation and diodes are included in the circuit to minimize the turn off time of each amplifying channel.

8 Claims, 2 Drawing Figures

AMPLIFIER, ESPECIALLY FOR LOW FREQUENCIES, UTILIZING PARALLEL AMPLIFYING CHANNELS WITHIN NPN TRANSISTORS

The invention relates to a low frequency amplifier, in which the amplitude modulated low frequency input signal is mixed with a saw toothed oscillation and by means of a level detector followed by a comparator is converted into a pulse-width modulated signal, the positive and negative parts of which are amplified in separate transistor channels.

In order to achieve accurate reproduction of the input signal, the pulse frequency must be at least four times higher than the frequency of the input signal. In order to cover the human auditory range, the pulse frequency must, therefore, be about 80 kilocycles.

Known amplifers working on this principle, for obvious reasons, required the exclusive use of very fast on-off semi-conductor switching elements, in order to achieve exact reproduction of the input signal. Such switching elements are expensive and only usable for relatively low powers and have only a relatively low voltage tolerance.

The invention has as its object the replacement of very fast switching transistors, which are expensive and only usable at relatively low power levels, by transistors which have longer switching times and a higher voltage tolerance, and which are less expensive.

These and other objects and advantages of the invention will appear more clearly from the following specification in connection with the accompanying drawings, in which.

Figure 1:
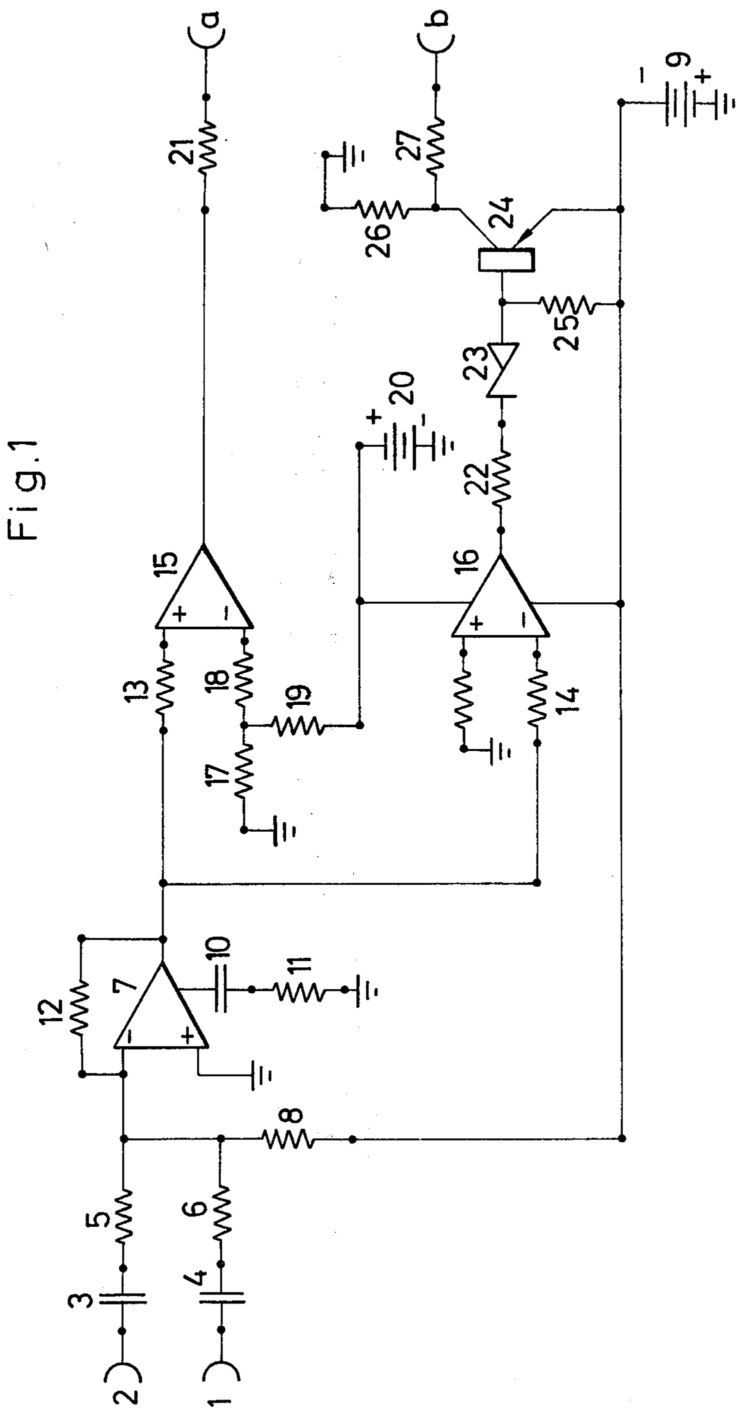
FIG. 1 represents the input portion of an amplifier circuit according to the invention.

The above outlined objects have been realized according to the invention, which is characterized primarily in that in the positive and negative amplifier stages which are both controlled by the complementary input stage, NPN transistors are used. A PNP transistor is arranged between the NPN input transistor and the first NPN transistor of the positive channel and is connected to an auxiliary voltage source in series with the supply voltage source for the positive channel, while the amplifying elements for the channels comprise transistors having a higher voltage tolerance and a medium switching time.

By the use according to the invention of an auxiliary voltage which is for example positive, over the supply voltage for the positive amplifier channel, which, for example is also positive, it is possible to prevent that in the conducting condition the voltage drop at the base emitter path of the first following transistor of the amplifier channel and the voltage drop at the collector emitter path of the auxiliary transistor have an effect on the voltage drop at the collector emitter path of the final transistor. Even though the voltage drop may only be reduced by 1.5 to 1 volt, the measures according to the invention reduce the losses at the end transistor by 30 to 40 percent. Furthermore, it is possible by means of the positive auxiliary voltage to control the base current of the first following transistor of the amplifier channel by a diode, so that the base current of the transistor is not limited before the saturation region is reached. When the voltage at the anode of the diode rises above the positive supply voltage the diode diverts further base current and prevents a further rise in the collector current. By means of these measures the switching-off time may be reduced by several factors, and driving transistors having a higher voltage tolerance may, therefore, be used.

According to a further feature of the invention, two comparators in a parallel circuit may be arranged between the operational amplifier and the input of the amplifier channels, the comparators serving on operation of an auxiliary voltage source to operate at differing threshold regions.

In such an arrangement the amplitude modulated input signal which is mixed with a saw-tooth oscillation arrives simultaneously at both comparators. These comparators each produce a predetermined output signal which is a pulsewidth modulated signal, the signal being different for each comparator in conformity with the threshold value of the input signal. The two pulse-width modulated signals differ from one another in that the pulse-width of the two signals differs by a predetermined time value independent of the original amplitude-modulated input signal and in conformity with the differing threshold voltages of the comparators.

After the initial inversion of one signal the signals are supplied to two separate channels and appear at the common output of both channels as positive and negative pulses respectively. Positive and negative pulses follow one another at the output, spaced by precisely the set time which was determined by the differing threshold voltages of the comparators, minus the lengthening of the pulses caused by the storage time of the transistors. By variation of the threshold voltages the time difference between the two pulses may be altered as desired and thereby matched to differing storage times.

If the threshold voltages are so chosen that the pulse width of the two signals produced in the comparators differs exactly by the value of the storage time, even the negative and positive pulses at the output will provide a signal of the known kind.

Referring now to the drawings in detail, the input terminal 1 of the amplifier is supplied with the amplitude modulated low frequency signal to be amplified. Input terminal 2 of the amplifier is supplied with a saw-tooth oscillation, which may be produced in known manner in a separate circuit.

The signals supplied to terminals 1 and 2 are fed through respective DC blocking capacitors 3 and 4 and through respective series resistors 5 and 6 to the inverting input of an operational amplifier. The same input of operational amplifier 7 is connected by way of a resistor 8 to a negative supply voltage source 9. A filter is connected to operational amplifier 7, the filter comprising capacitor 10 and resistor 11 and serving as damping means for damping any tendency of the amplifier to oscillate. The resistor 12 connected between the inverting input and the output of operational amplifier 7, together with the three resistors 5, 6 and 8 serves to determine the amplification of the amplifier. Resistor 8, which is connected to the negative supply voltage, effects a DC bias on the output signal and thereby determines the relative proportions of the pulse halves at the output of the complete amplifier. This proportion may be set by variation of resistor 8 to exactly 1:1 at 0 volts input voltage.

The output voltage of operational amplifier 7 is taken by way of the resistors 13 and 14 to the inputs of two comparators 15 and 16. The two comparators 15 and 16 are switched in opposite senses, so that the normal and the inverting input is supplied alternately.

The threshold voltage of both comparators 15 and 16 is determined by the other input of each comparator. The second input of comparator 16 is connected to ground, while the second input of comparator 15 is connected by way of a T-network of resistors 17, 18 and 19 to a positive supply source 20. Resistors 17 and 18 are connected in series between ground and the second input of comparator 15, while resistor 19 is connected to the common point of resistors 17 and 18. The other terminal of resistor 19 is connected to the positive terminal of voltage source 20 which, although shown schematically for comparator 16 only, supplies both comparators 15 and 16 and operational amplifier 7. A similar arrangement exists also for supply voltage source 9.

The threshold value of comparator 15 may be set by choice of the values of resistors 17 and 19, which serve as a potential divider.

Figure 2:
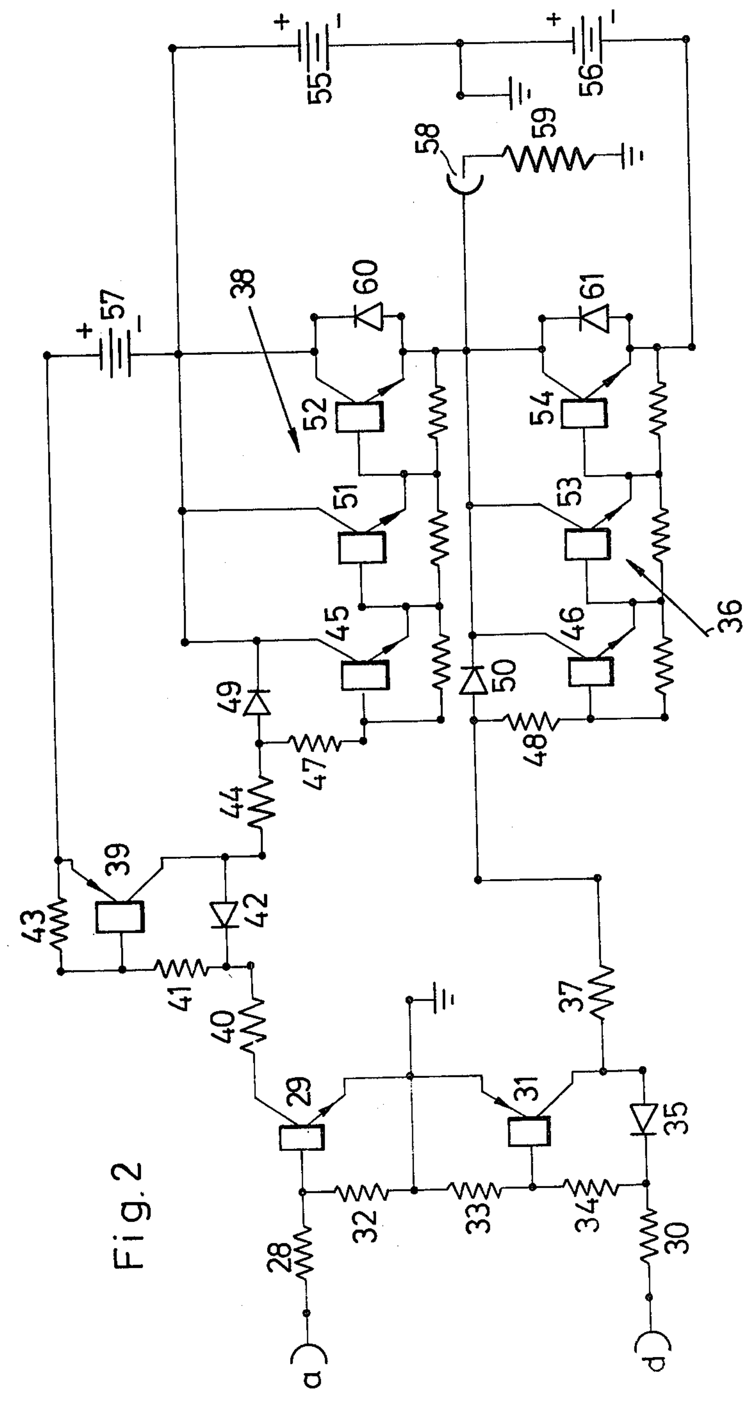
FIG. 2 shows the output portion of an amplifier circuit according to the invention.

The output of comparator 15 is connected by way of a resistor 21 to the input terminal *a* of the amplifier portion shown in FIG. 2. Similarly the output of comparator 16 is connected by way of a resistor 22, a Zener diode 23 and a transistor 24 to the terminal *b* shown in FIG. 2.

As comparators 15 and 16 produce rectangular pulses, for example +0.7 volts and −3 volts, and the negative power stage generally will only become conductive at a negative input voltage greater than −3 volts; an NPN transistor 24 is arranged between the output of comparator 16 and the terminal *b* which receives at its emitter by way of voltage source 9 a voltage of for example −5 volts. The base-emitter resistor 25 of transistor 24 serves, as do all the baseemitter resistors of the following transistors, to rapidly conduct away any charge which remains for a short time on the base on account of the input capacitance. The 4.5 volt Zener diode 23 between the output of comparator 16 and the base of transistor 24 serves to ensure that transistor 24 can only conduct when the full negative supply voltage is available. Furthermore the circuit is thereby made less sensitive to temperature variations. The resistors 21 and 22 connected directly to the outputs of comparators 15 and 16 respectively serve merely for short-circuit protection.

The collector of transistor 24, which is connected by way of a resistor 26 to ground, is connected through resistor 27 to terminal *b* of FIG. 2, in which the final and power stage is shown.

The positive input pulses at *a* are supplied by way of a resistor 28 to the base of a transistor 29, which is connected by its emitter to ground. In a similar manner the negative pulses at terminal *b* are supplied by way of a resistor 30 to the base of a transistor 31, which is also connected by its emitter to ground. The bases of both transistors 29 and 31 are connected through resistors 32 and 33 respectively to ground. As transistor 31 is a PNP transistor, the base-collector path thereof is shunted by a series circuit comprising a resistor 34 and diode 35. The negative signal from resistor 30 is supplied to the common point of resistor 34 and diode 35.

The collector output of transistor 31 supplies a transistor amplifier chain 36 through a resistor 37. Transistor amplifier chain 36 is similar to transistor amplifier chain 38, which is described hereinafter.

Transistor amplifier chain 38 is not however supplied directly from transistor 29, but by way of an auxiliary transistor 39. The presence of a positive signal at terminal *a* causes NPN transistor 29 to conduct and turns on PNP transistor 39 by way of resistor 40. The use of PNP transistor 39 has the effect that in transistor chain 38 NPN transistors, which are preferable, can be used. The base-collector path of transistor 39 is shunted by a series circuit comprising a resistor 41 and a diode 42, which serves to ensure that transistor 39 can never reach saturation. Resistor 40 is connected with the common point of circuit elements 41 and 42. The resistor 43 in the base emitter path of transistor 39, which is provided in all such transistors because of the short switching times, serves to ensure fast removal of charge at the transistor base. For transistors 29 and 31 the respective resistors 32 and 33 serve the function of the said resistor 43.

The collector of transistor 39 serves by way of resistor 40 to turn on the base of transistor 45 of the transistor amplifier chain 38. In a similar manner the base of transistor 46 of amplifier transistor chain 36, which is connected to resistor 37, is turned on.

Care must be taken that transistors 45 and 46, as with transistors 39 and 31, must not operate in saturation. In order to ensure this, series circuits comprising resistors 47, 48 and diodes 49, 50 are provided in the base-collector paths of transistors 45 and 46 respectively. The transistors 51, 52 and 53, 54 following transistors 45 and 46 respectively do not need to be prevented from operating in the saturation region, since it is only in the first transistors 45 and 46 that, because of the lower collector current, greater storage times are present.

The voltage supply for transistor chains 36 and 38 is by way of voltage sources 55 and 56 which are grounded at their common point. The voltage source 55 is connected to each of the collectors of transistors 45, 51 and 52 and also to an auxiliary voltage source 56, which at its other, i.e. its positive terminal, is connected to the collector of transistor 39. The voltage source 56 supplies the emitter of transistor 54. The emitter of the final transistor 52 of chain 38 is connected to each of the collectors of transistors 46, 53 and 54 of chain 36 and to the output 58 of the amplifier circuit, from which the power may be taken to supply, for example, a loudspeaker 59 or the like.

The circuit portion described above operates as follows: When a positive signal is supplied to terminal *a*, NPN transistor 29 is turned on through resistor 28 and thereby turns on PNP transistor 39 through resistor 40. When a PNP transistor 39 is conducting, the auxiliary voltage of voltage source 57 is supplied through resistor 44 to the base of transistor 45. Because of transistor 45, the transistors 51 and 52, which follow it, are rendered conductive, and the output load 59 is connected to the positive supply voltage.

The auxiliary voltage of voltage source 57 is chosen so as at least to compensate for the voltage drop between the collector and emitter of auxillary transistor 39 and the voltage drop between the base and emitter of transistor 45.

On supply of negative pulses to terminal *b*, a negative output results at the output load 59 in an analogous manner.

As has already been indicated, the diodes 49 and 50 connected to transistors 45 and 46 respectively divert excess base current immediately prior to these transistors reaching saturation. In this manner the storage time of the transistors is lowered.

The diodes 60 and 61 in the collector-emitter path of transistors 52 and 54 respectively serve to divert the back EMF of inductive loads, which must not be left out of consideration in the case of loudspeakers, for example.

In a practical realization of the circuit according to the invention, a supply voltage of ±45 volts and an output current of 10 Amps gave an output power of over 400 watts at a switching frequency of 80 kHz and an efficiency of over 90 percent. By the use of two further final transistors of the RCA type 2N6032, the output power may be multiplied by a factor of 5, corresponding to an output power of 2000 watts.

It is, of course, to be understood that the present invention is, by no means, limited to the specific showing in the drawings, but also comprises any modifications within the scope of the appended claims.

What is claimed is:

1. In an amplifier, especially a low frequency amplifier; input circuit means having positive and negative pulses therewith and including complementary means to receive and mix an amplitude modulated signal and a sawtooth signal, means in the form of comparator means for converting the mixed signal into a pulse width modulated signal, said input circuit means comprising a first output terminal to which the positive pulses of the pulse width modulated signal are supplied and a second output terminal to which the negative pulses are supplied, a pair of output transistors each having the base terminal connected to a respective one of said output terminals, first and second amplifying channels each comprising a plurality of NPN transistors having the output ends connected to a common load terminal, the collector of the said output transistor which receives the negative pulses being connected to the base of the input transistor of said first channel, an auxiliary PNP transistor, the collector of the other of said output transistors being connected to the base of said PNP transistor, the collector of said PNP transistor being connected to the base of the input transistor of said second channel, and a source of auxiliary voltage connected between the emitter of said PNP transistor and the collector of the input transistor of said second channel, said NPN transistors having a high voltage tolerance and a medium switching time.

2. In an amplifier, especially a low frequency amplifier; input circuit means having means to receive and mix an amplitude modulated signal and a sawtooth signal, means in the form of comparator means for converting the mixed signal into a pulse width modulated signal, said input means comprising a first output terminal to which the positive pulses of the pulse width modulated signal are supplied and a second output terminal to which the negative pulses are supplied, a pair of output transistors each having the base terminal connected to a respective one of said output terminals, first and second amplifying channels each comprising a plurality of NPN transistors in series and having the output ends connected to a common load terminal, the collector of the said output transistor which receives the negative pulses being connected to the base of the input transistor of said first channel, a PNP transistor, the collector of the other of said output transistors being connected to the base of said PNP transistor, the collector of said PNP transistor being connected to the base of the input transistor of said second channel, a source of voltage connected between the emitter of said PNP transistor and the collector of the input transistor of said second channel, said NPN transistors having a high voltage tolerance and a medium switching time, and a resistance and a diode connected in series between the base and collector of each said input transistor, each diode being poled toward the respective collector.

3. In an amplifier, especially a low frequency amplifier; input circuit means having means to receive and mix an amplitude modulated signal and a sawtooth signal, means in the form of comparator means for converting the mixed signal into a pulse width modulated signal, said input circuit means comprising a first output terminal to which the positive pulses of the pulse width modulated signal are supplied and a second output terminal to which the negative pulses are supplied, a pair of output transistors each having the base terminal connected to a respective one of said output terminals, first and second amplifying channels each comprising a plurality of NPN transistors in series and having the output ends connected to a common load terminal, the collector of the said output transistor which receives the negative pulses being connected to the base of the input transistor of said first channel, a PNP transistor, the collector of the other of said output transistors being connected to the base of said PNP transistor, the collector of said PNP transistor being connected to the base of the input transistor of said second channel, a source of voltage connected between the emitter of said PNP transistor and the collector of the input transistor of said second channel, said NPN transistors having a high voltage tolerance and a medium switching time, and a current limiting resistor between the collector of said PNP transistor and the base of the input transistor of said second channel and of such a size as to prevent said input transistor from going to saturation, and a diode connected between the end of said resistor remote from the base of the input transistor and the collector of the input transistor and poled toward the collector.

4. In an amplifier, especially a low frequency amplifier; input circuit means having means to receive and mix an amplitude modulated signal and a sawtooth signal, means in the form of comparator means for converting the mixed signal into a pulse width modulated signal, said input circuit means comprising a first output terminal to which the positive pulses of the pulse width modulated signal are supplied and a second output terminal to which the negative pulses are supplied, a pair of output transistors each having the base terminal connected to a respective one of said output terminals, first and second amplifying channels each comprising a plurality of NPN transistors in series and having the output ends connected to a common load terminal, the collector of the said output transistor which receives the negative pulses being connected to the base of the input transistor of said first channel, a PNP transistor, the collector of the other of said output transistors being connected to the base of said PNP transistor, the collector of said PNP transistor being connected to the base of the input transistor of said second channel, a source of voltage connected between the emitter of said PNP transistor and the collector of the input transistor of said second channel, said NPN transistors having a high voltage tolerance and a medium switching time, and a current limiting resistor connected between the collector of said other output transistor and the base of said PNP transistor to prevent the latter from going to saturation, and a diode having the positive side connected to the collector of said PNP transistor and the negative side connected to the end of said resistor which is remote from the base of said PNP transistors.

5. In an amplifier, especially a low frequency amplifier; input circuit means having means to receive and mix an amplitude modulated signal and a sawtooth signal, means in the form of comparator means for converting the mixed signal into a pulse width modulated signal, said input circuit means comprising a first output terminal to which the positive pulses of the pulse width modulated signal are supplied and a second output terminal to which the negative pulses are supplied, a pair of output transistors each having the base terminal connected to a respective one of said output terminals, first and second amplifying channels each comprising a plurality of NPN transistors in series and having the output ends connected to a common load terminal, the collector of the said output transistor which receives the negative pulses being connected to the base of the input transistor of said first channel, a PNP transistor, the collector of the other of said output transistors being connected to the base of said PNP transistor, the collector of said PNP transistor being connected to the base of the input transistor of said second channel, a source of voltage connected between the emitter of said PNP transistor and the collector of the input transistor of said second channel, said NPN transistors having a high voltage tolerance and a medium switching time, and said comparator means comprising respective comparators for producing the positive and negative pulses respectively, an amplifier receiving said mixed signal as an input and having an output connected to the input sides of said comparators, and means establishing respective threshold voltages for said comparators.

6. The method of amplifying an amplitude modulated signal which comprises; mixing the amplitude modulated signal with a sawtooth signal, converting the mixed signal to a pulse width modulated signal and separating the positive pulses of the pulse width modulated signal from the negative pulses thereof, inverting the negative pulse, supplying the positive pulses and the inverted negative pulses to the input ends of respective amplifying channels having NPN transistors, supplying a common load terminal from the emitter side of the output transistor of one of said channels and from the collector side of the output transistor of the other of said channels, and compensating for voltage drop in the emitter-collector sides by way of an auxiliary PNP transistor and auxiliary voltage source.

7. The method of amplifying an amplitude modulated signal which comprises; mixing the amplitude modulated signal with a sawtooth signal, converting the mixed signal to a pulse width modulated signal and separating the positive pulses of the pulse width modulated signal from the negative pulses thereof, inverting the negative pulse, supplying the positive pulses and the inverted negative pulses to the input ends of respective amplifying channels having NPN transistors in series, supplying a common load terminal from the emitter side of the outer transistor of one of said channels and from the collector side of the output transistor of the other of said channels, and adjusting the widths of said positive and negative pulses to compensate for capacitance effects in the system.

8. The method of amplifying an amplitude modulated signal which comprises; mixing the amplitude modulated signal with a sawtooth signal, converting the mixed signal to a pulse width modulated signal and separating the positive pulses of the pulse width modulated signal from the negative pulses thereof, inverting the negative pulse, supplying the positive pulses and the inverted negative pulses to the input ends of respective amplifying channels having NPN transistors in series, supplying a common load terminal from the emitter side of the output transistor of one of said channels and from the collector side of the output transistor of the other of said channels, and operating the transistors at the input ends of the amplifier channels below saturation at all times.

* * * * *